Sept. 22, 1970 R. F. PENOYER 3,530,231

BONDING HIGH DENSITY INTERCONNECTION LINES

Filed Jan. 15, 1969

INVENTOR
Ralph F. Penoyer

BY Littlepage, Quaintance, Wray & Aisenberg
ATTORNEY 3,530,231
BONDING HIGH DENSITY INTERCONNECTION LINES Ralph F. Penoyer, Shelburne, Vt., assignor to International Business Machines Corporation, Armonk, N.Y., a corporation of New York Filed Jan. 15, 1969, Ser. No. 791,456
Int. Cl. H05k 3/32
U.S. Cl. 174—68.5 11 Claims

ABSTRACT OF THE DISCLOSURE

In microminiaturized circuitry a plurality of closely spaced thin conducting lines are simultaneously bonded to closely spaced areas of a circuit board by solder reflow method. A series of grooves are formed in contact points of the conducting lines. These grooves provide empty spaces for accommodating excess reflowed solder to prevent lateral flow of the solder and thereby shorting between adjoining lines.

The present invention relates to methods of bonding conducting wires or lines to a substrate. More particularly, it relates to methods of bonding a plurality of closely spaced electrical or metallic lines to closely spaced conductive pads or areas on a circuit, such as a printed circuit board.

With the present trend toward micro-miniaturization, electrical circuits, especially circuits commonly used in thin film magnetic memory systems, computers and the related devices, are becoming increasingly small and dense. Scores or even several hundred conducting lines are packed in a small area no greater than the size of a dime. An average conducting line is only a few mils wide, usually 5 mils or less, and the distance between two neighboring lines is 10 mils or less between centers.

Figure 1:
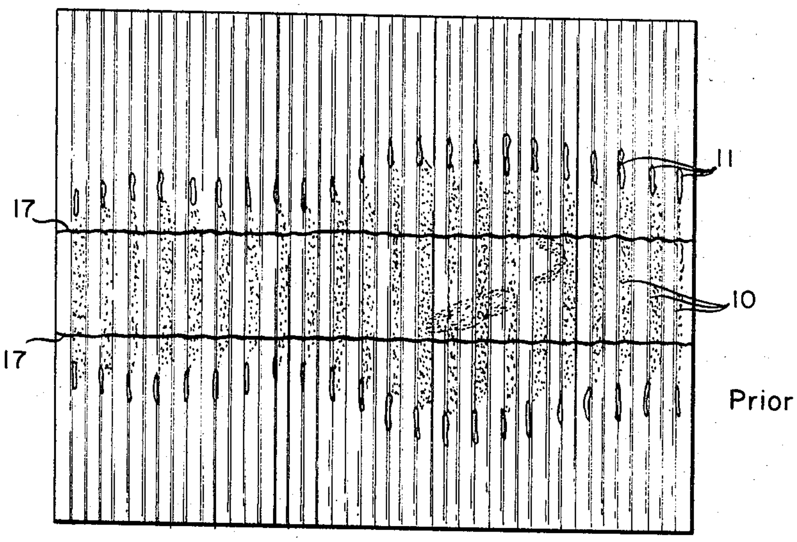

Often it is necessary to bond closely spaced lines of one circuit board to closely spaced lines, conductive lands or pads or other areas of another board or substrate. Customarily, the bonding is accomplished by standard solder reflow techniques. A thin film of solder is deposited on the conducting lines and/or contact areas of the substrate, and the lines are then joined to contact areas of the substrate under heat and pressure. This process works satisfactorily when the lines are relatively wide apart. However, when the distance between the adjoining lines is only a few mils, 10, 8, 6, 4, 2 mils or even less, the bonding of a plurality of lines by the reflow process causes solder expulsion and consequent bridging between neighboring lines by the solder which flows out of the joints or is forced outward therefrom under pressure. In FIG. 1, which is a micrograph of an array of conducting lines joined to a substrate by prior art reflow solder techniques, numeral 11 indicates solder bridges shorting neighboring interconnection lines 10.

To overcome this bridging or shorting problem, prior art has suggested the removal of solder beads by wiping, etc. It has also been proposed to form in the substrate on each side of the joint small recesses or moats for receiving and retaining the bond material which is flowed laterally outward from the joint upon application of pressure. Those proposals may alleviate the bridging problem where the conducting lines are relatively wide apart. However, in micro-miniaturized circuitry, where several hundred thin lines are closely packed, neither is it practical to remove each single bead, nor is it desirable to retain all the reflowed solder in a moat, since an accidental breakage or leakage of the solder in the moat can cause shorting, and the moat concept requires valuable lateral space.

Another prior art attempt to limit solder expulsion and consequent bridging is to apply little or no pressure to joint during solder reflow. While this method is partially successful in preventing bridging, the resulting joints are often unreliable mechanically and electrically.

A principal object of this invention is to provide an improved method of bonding a plurality of closely spaced thin conducting lines or wires to desired areas on a substrate by means of a conductive adhesive, such as solder, without causing solder bridges between the adjoining lines. Another object of the invention is to provide a method of joining electrical or metallic lines or wires to conductive leads or pads or other desired areas of a printed circuit board or similar substrate, such that the bonds between the wires and the contact areas are of superior mechanical strength. Another object of the invention is to eliminate the formation of conductive solder beads or bridges between adjacent conducting lines or wires during the bonding thereof by solder reflow process. Another object of the invention is to provide a quick and efficient method of joining simultaneously a plurality of closely spaced conducting printed lines to closely spaced conductive areas of a substrate or a circuit board by solder reflow techniques. Another object of the invention is to reduce solder bridging caused by the application of greater than normal pressure to a joint during solder reflow. These and other objects and advantages reside in certain novel methods and processes and the steps of carrying out such methods and processes as will hereinafter be more fully described and pointed out in the appended claims.

Briefly, according to the present invention, during reflow solder bonding of closely spaced conducting lines or wires, the problem of solder bridging is prevented by forming grooves or channels in the wires at the contact points thereof, such that during the reflow step substantially all of the excess melted solder under pressure flows into the grooves and is retained therein in the form of small fillets. The grooves may be formed by any of the known techniques, such as photo-etching, reverse sputtering, etc., and the grooves may run in any direction. However, for better results it is preferred that the grooves be transverse to the direction of the conducting lines. The shape and size of the grooves are of no particular significance, as long as the grooves are deep and/or numerous enough to accommodate all the solder expelled at the contact points of the conducting lines. Preferably, the grooves have enough capacity to accommodate at least all of the solder originally deposited at the conducting lines. If this is done, excessive pressure short of an amount that would flatten the grooves applied in a bonding operation will not cause solder bridging. A more detailed description of the method of this invention will be understood by reference to the accompanying drawings and the photomicrograph, which are here provided for that purpose.

The foregoing and other objects, features, and advantages of the present invention will be apparent from the following more particular description of the preferred embodiments of the invention as illustrated in the accompanying drawings.

In the drawings:

FIG. 1 is a photomicrograph showing in enlarged scale solder bridges formed between adjacent conducting lines during the heat and pressure bonding thereof by a thermally pulsed Nichrome ribbon.

Figure 2:
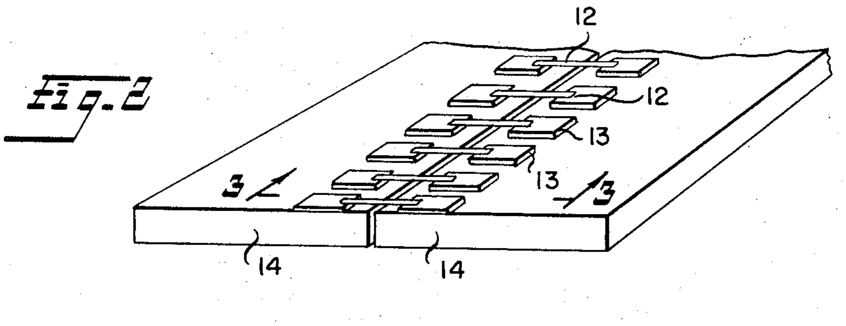
Prior Art Fig. 2
Figure 3:
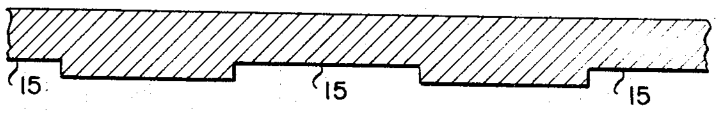
Figure 4:
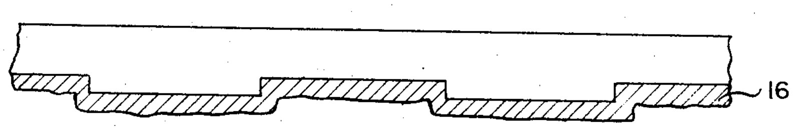
Figure 5:
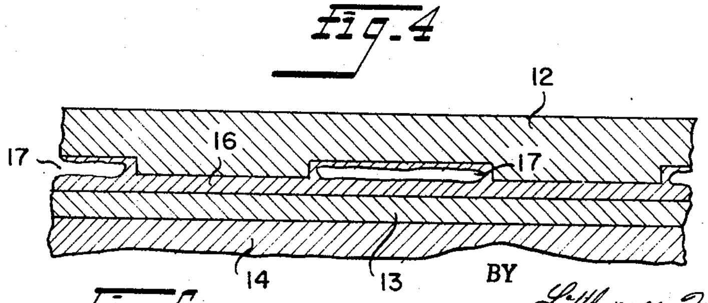

FIG. 2 is an enlarged perspective view of the environment in which the present invention is used, showing a plurality of closely spaced electrical or magnetic lines joining closely spaced conductive pads on two Mylar circuit boards placed side by side; and FIGS. 3, 4 and 5 are greatly enlarged partial sections of a conducting line on the line 3—3 in FIG. 2, showing preferred embodiments of the present invention.

FIG. 2 shows an environment in which the present invention may be practiced. Numeral 12 indicates an array of closely spaced electrical or magnetic lines or wires joining closely spaced conductive pads or contact areas 13 of two printed circuit boards 14 made of Mylar or any other suitable dielectric material. The conducting lines 12 are normally much more closely spaced than are shown in the drawing for ease of understanding. Lines 12 may be flexible round wires, flat foils or strips of a conducting material or they may be thin conducting films printed, plated, laminated or aputtered on an insulating substrate.

In the preferred embodiment described herein, interconnection or strip lines 12 are photoetched from a copper-Teflon laminate, Teflon being used as an interconnection line carrier for handling and registration purposes. The interconnection lines are cross-etched to provide a series of grooves 15 at the contact point of each of the lines. Grooves 15 are deep enough to accommodate all the solder that is deposited for bonding purposes, as described below. The grooves provide empty spaces for reflowed solder which is forced out of the joint under pressure and prevent solder bridging between the closely spaced striplines. In a preferred embodiment the lines are flat and are about 5 mils wide and 1.4 mils thick; grooves, about 0.5 mil deep, extend across the line and extend longitudinally about 5 mils. Successive grooves are spaced about 5 mils apart.

Before juxtaposing lines 12 and pads 13, a thin film 16 of a tin-lead solder is deposited on the grooved contact portion of each line as shown in FIG. 4. The film may be deposited by any known method, such as vaporization, electroplating or electroless plating, brushing, spraying, etc. And instead of the tin-lead solder, any other meltable conductive adhesive of suitable composition may be used therefor. Further, if desired, adhesive film 16 may be formed in the contact areas or pads of the substrate in addition to or instead of on the conducting lines.

Next the solder-coated lines 12 are positioned in contact with the conductive pads 13, FIG. 5. Subsequently, the coated lines 12 are bonded to pads 13 under heat and pressure, which in the preferred embodiment were applied by two thermally pulsed thin Nichrome ribbons, each mounted on a separate thin resilient pad and placed on the interconnection line carrier above the contact points transversely to the direction of the conducting lines 12. In FIG. 1, numeral 17 indicates an impression left on the plastic substrate by one of the heated Nichrome ribbons.

In FIG. 5, only some of the solder is shown within grooves 16, and a relatively thick layer of solder separates the raised portion of conducting line 12 and conductive pad 13. If more pressure were applied during the solder reflow, the result would have been to force more of the solder into grooves 15, rather than between adjacent lines 12.

It has been found that under proper conditions of heat and pressure substantially all of the excess melted solder, by the present method, flows into and is confined by surface tension within the empty spaces of grooves 15, and forms fillets 17 therein, instead of forming bridges between the conducting lines 12. Thus, grooves 15 not only eliminate the circuit shorting problem, they also facilitate in the achievement of mechanically superior bonds due to the formation of multiple solder fillets 17.

This method has been been successfully used to bond an array of conducting lines where each line was 4 mils wide and where the distance between the neighboring lines was 4 mils. It is believed that equally satisfactory results can be achieved, by the present method, in cases where the width of an average line is as little as 2 mils or even less and where two neighboring lines are spaced no more than 4 mils on centers or less. Further, experiments indicate that to obtain good bonds by this method it is not advisable to squeeze out all the solder from the joints and to bring the conducting lines into mating contact with the conductive pads In fact, excessive pressure would tend to flatten the grooves at the contacting interface and thus unnecessarily create bridging hazards.

A particular advantage of the preferred method of heating is that in addition to melting the solder, the Nichrome heating elements cause a Mylar or other thermoplastic substrate beneath or adjacent to the ribbons to soften and seal the areas between each interconnection line. However, the present invention is not limited to this method of heating. Other suitable sources of heat and pressure may be used in place of the Nichrome ribbons.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of bonding at least one connection line element to at least one substrate contact area element in a plurality of closely spaced adjacent elements by a reflow process which process comprises:

making in a contact surface of the line element a number of spaced grooves sufficiently deep to accommodate excess adhesive material, depositing a film of a suitable meltable adhesive material on a surface of at least one of the elements, and placing the contact surface of the line element on the contact area of the substrate element, and joining the line element to the substrate element under heat and pressure, and reflowing substantially all excess adhesive from surfaces of the elements into said grooves, thereby preventing flow of the adhesive materials between spaced elements.

2. The method as set forth in claim 1 wherein the joining comprises joining connection line surfaces on a thin film of a printed circuit board with contact area surfaces on a substrate.

3. The method as set forth in claim 1 wherein the depositing adhesive material comprises depositing the adhesive material on the connection line surface.

4. The method as set forth in claim 1 wherein the depositing comprises depositing adhesive material on contact area surfaces on a substrate.

5. The method as set forth in claim 1 wherein the making grooves comprises making grooves transverse to an elongated direction of the connection line surface.

6. A method of joining simultaneously a plurality of closely spaced conducting lines to suitable closely spaced contact areas of a substrate by a reflow process which comprises:

making at contact surfaces of said lines a series of spaced transverse grooves deep enough to accommodate all excess reflowed adhesive, depositing a film of a meltable adhesive on the contact surfaces of said lines, placing the contact surfaces on the contact areas, and joining the lines with the desired contact areas of the substrate simultaneously under heat and pressure, and reflowing a substantial portion of the adhesive from the surfaces into the grooves, thereby preventing flow of the meltable adhesive between adjacent lines and between adjacent substrate contact areas.

7. The method as set forth in claim 6 wherein the joining comprises joining a plurality of closely spaced thin conducting lines of a printed circuit board to closely spaced contact areas on a substrate.

8. The method as set forth in claim 7 wherein the depositing of an adhesive film comprises depositing a conductive solder.

9. A method of joining simultaneously a plurality of closely spaced thin electrical conducting lines formed by photoetching a copper-insulator laminate to closely spaced conductive areas of a substrate by solder reflow process which comprises:

etching at contact points of each of said lines a series of space grooves deep enough to accommodate substantially all solder used for making joints, depositing a film of tin-lead solder at each of the contact points of the conducting lines, placing the contact points of the lines on the conductive areas of the substrate, and applying heat and pressure to the contact points and the conductive areas, joining said lines to said conductive areas, and reflowing substantially all excess solder into said grooves, thereby preventing short circuiting of the contact points and areas by the solders.

10. A solder bonded apparatus comprising:

at least one closely spaced contact area element on a substrate, at least one closely spaced elongated interconnection line element contacting the contact area element on the substrate in a plurality of closely spaced elements and having spaced grooves extending across the line in a direction transverse to an elongated direction of the line, and solder disposed between the line and the contact area on the substrate and within the grooves, the grooves defining dimensions sufficient to hold excess solder flowed from between the line and the contact area on the substrate, thereby preventing short circuiting between the closely spaced elements.

11. A multiple stripline pressure bonded connection comprising:

at least one insulator substrate with a plurality of closely spaced contact areas thereon, a plurality of closely spaced elongated electrical conductive elements adjacent the closely spaced contact areas, the elements having in faces thereof toward the contact areas spaced transverse grooves extending across the elements, solder disposed between the contact areas and the elements and within the grooves thereof, the solder being limited to positions directly between the elements and the contact areas, whereby short circuiting of adjacent contact areas and elements by the solder is prevented.

References Cited

UNITED STATES PATENTS

| | | | |
|---|---|---|---|
| 2,530,552 | 11/1950 | Stoddard | 29—501 |
| 3,344,316 | 9/1967 | Stelmak | 174—68.5 XR |

DARRELL L. CLAY, Primary Examiner

U.S. Cl. X.R.

29—501, 626; 174—88; 317—101; 339—275

PO-1050
(5/69)

UNITED STATES PATENT OFFICE
CERTIFICATE OF CORRECTION

Patent No. 3,530,231 Dated September 22, 1970

Inventor(s) Ralph F. Penoyer

It is certified that error appears in the above-identified patent and that said Letters Patent are hereby corrected as shown below:

Column 4, line 5, a period should be inserted between "pads" and "In";
Column 5, line 7, "space" should be --spaced--.
Column 5, line 18, "solders" should be --solder--.

SIGNED AND SEALED
DEC 1 - 1970

(SEAL)
Attest:

Edward M. Fletcher, Jr.
Attesting Officer

WILLIAM E. SCHUYLER, JR.
Commissioner of Patents